United States Patent [19] | [11] Patent Number: 5,048,068
Turchi | [45] Date of Patent: * Sep. 10, 1991

[54] MAGNETICALLY OPERATED PULSER

[76] Inventor: Peter J. Turchi, 6503 Masefield St., Worthington, Ohio 43085

[*] Notice: The portion of the term of this patent subsequent to Mar. 27, 2007 has been disclaimed.

[21] Appl. No.: 437,396

[22] Filed: Nov. 16, 1989

[51] Int. Cl.$^5$ .............................................. H01J 35/06
[52] U.S. Cl. ..................................... 378/121; 378/138; 313/157; 315/62; 315/111.81; 315/344
[58] Field of Search .......................... 315/344, 267, 62; 307/419

[56] References Cited

U.S. PATENT DOCUMENTS 3,562,583  2/1971  Zollweg ............................ 315/344
·4,293,794 10/1981 Kapetanakos ..................... 315/344
4,912,738  3/1990  Turchi ................................. 315/62

Primary Examiner—Eugene R. Laroche
Assistant Examiner—Son Dinh
Attorney, Agent, or Firm—Freilich Hornbaker Rosen

[57] ABSTRACT

A diode pulser is described which comprises a diode and an inductor connected in series, the impedance of the diode being controllable to suddenly increase the impedance to produce a high voltage pulse across the diode. The diode can include a pair of spaced electrodes (12, 14 in FIG. 2) forming a gap between them across which electrons move when a voltage is applied. To increase the impedance, a magnetic field (38) is suddenly applied parallel to the electrode surfaces, to bend the electron paths so as to require a much higher voltage to move the electrons across the gap, the inductor (26) creating such voltage to maintain the current flow for a brief time. The diode pulser is useful as a rapid-acting switch, and as a source of high energy electrons that are useful to generate X-rays, microwaves, and for other purposes.

8 Claims, 3 Drawing Sheets

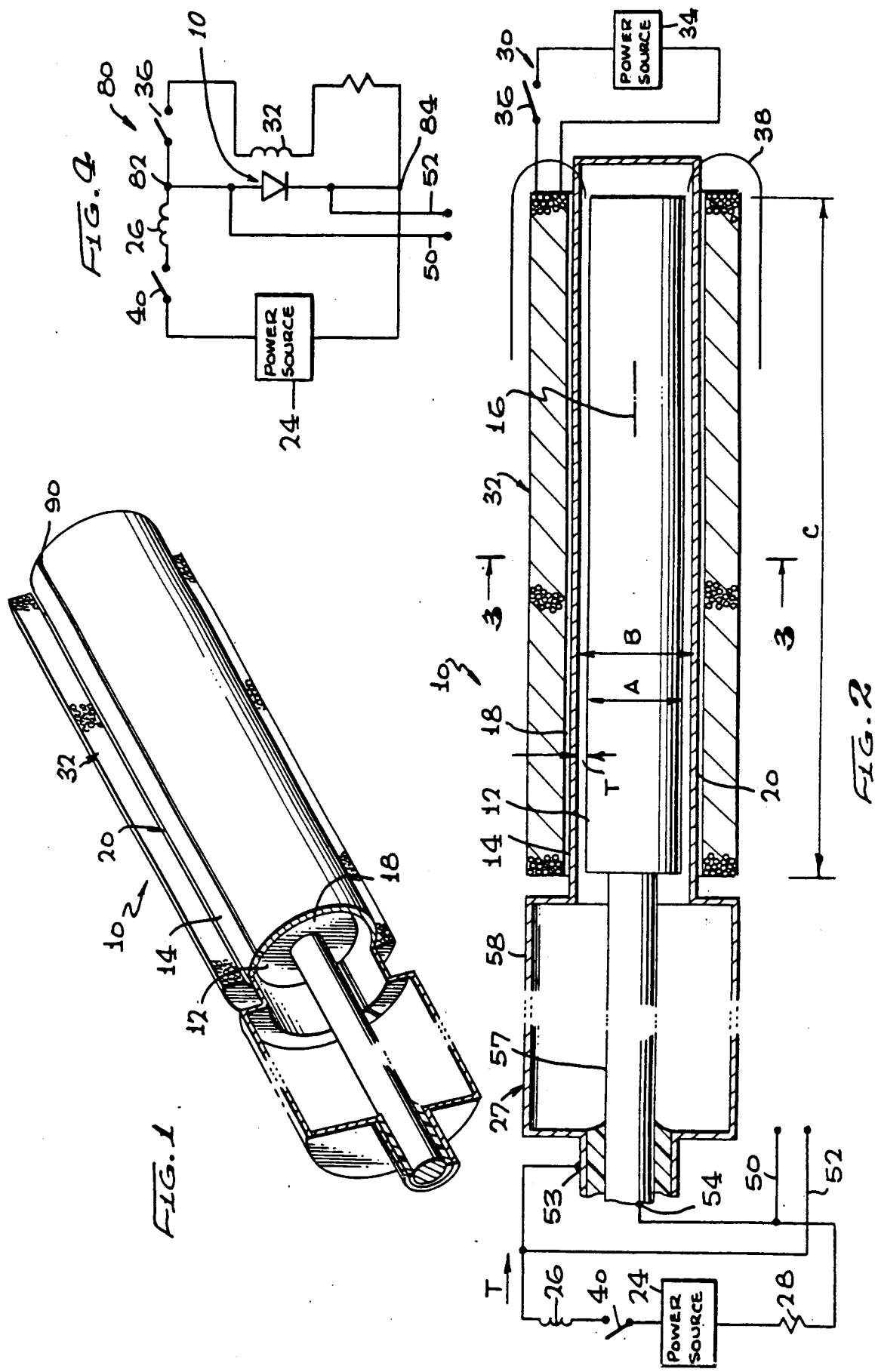

FIG. 7
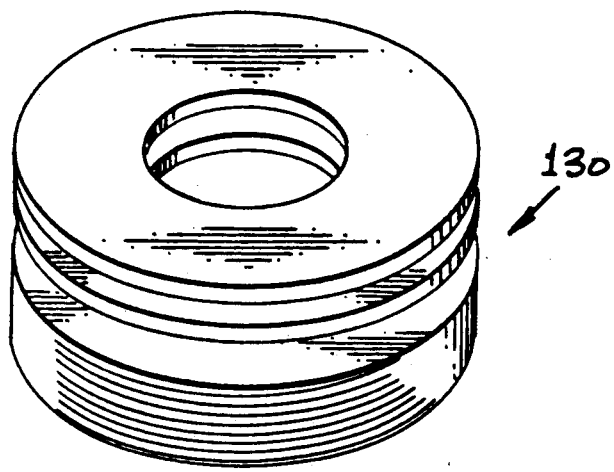
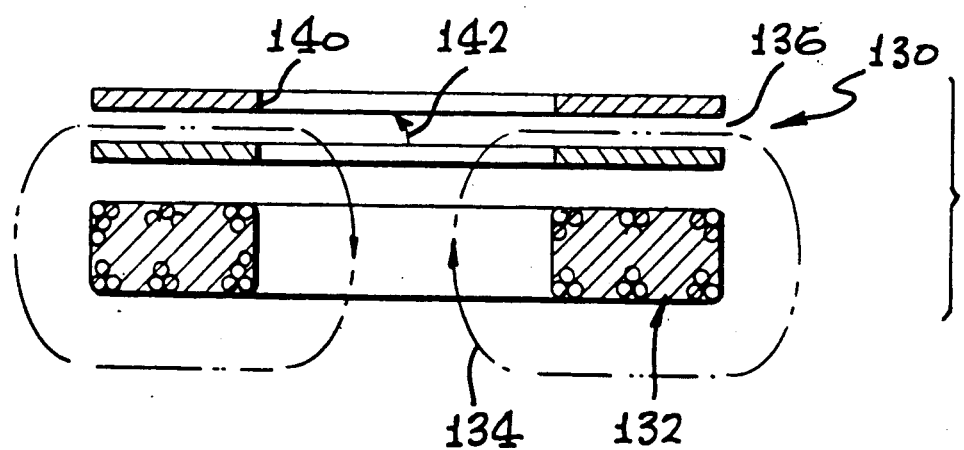
FIG. 8

5,048,068

MAGNETICALLY OPERATED PULSER

BACKGROUND OF THE INVENTION

High-power pulsers, which deliver peak power in excess of 1000 watts at voltages above 1000 volts, can include an energy storage device and an impedance switching device. The switching device is often the device that limits the pulser capability. In one example, a high current passing through an inductor and a switching device, creates a voltage across the switching device which rapidly increases when the resistance of the switching device increases. However, where high voltages on the order of magnitude of 100 KV are to be generated at moderate to high current levels, a large and costly switching device may be required. A switching device which could be used at high voltage and current levels, which was relatively compact and of simple construction, would be of considerable value.

There are various approaches to the production of short rise-time pulses of high energy electrons, used to create pulses of x-rays, laser beams, and microwaves. One approach involves charging a bank of capacitors, and then closing a switch to apply the capacitor voltage across a pair of electrodes. This requires a high voltage source to charge the capacitors, a cumbersome bank of capacitors, and a switch to operate at high voltage. Another approach is to establish a current through an inductor (whose energy storing capacity is about two orders of magnitude higher than a capacitor bank of the same size), and through a closed switch, with a diode connected in parallel with the switch. When the switch is opened, the current passes through the diode, whose higher impedance results in a high voltage across the diode. The high voltage also appears across the switch as it is opened, which reduces switch life. Also, stray inductances along the conductors coupling the diode electrodes to opposite sides of the switch, oppose a rapid rise of current through the diode and reduce the voltage across the diode and the energy of the electrons. A pulser for generating pulses of high energy electrons, which was compact, of long life, and of relatively simple design would also be of considerable value.

SUMMARY OF THE INVENTION

In accordance with one embodiment of the present invention, a pulser is provided which facilitates the generation of high voltage pulses. The pulser includes a diode having a pair of spaced electrodes that form a gap between them. A magnet such as a wire coil and a control such as a switch for carrying current to the wire coil are also provided, wherein the control can be operated to suddenly apply a magnetic field through the gap, perpendicular to the thickness of the gap between the electrodes. The magnetic field causes any electrons that are urged to pass through the gap by a voltage between the electrodes, to suddenly move along a curved path that results in a suddenly greater impedance across the gap.

A circuit can be coupled to the electrodes for establishing a voltage across the electrodes and for passing a current between them and through an inductor in series with the electrodes. When the magnetic field has been suddenly applied, the inductor continues the current flow for a short period, during which the voltage across the electrodes rises to a high level. The apparatus is useful as a switch that can rapidly switch between moderate and high impedances, as a source of high voltage and high current pulses, and as a source of high energy electrons useful in generating X-rays and microwaves and for other purposes.

The novel features of the invention are set forth with particularity in the appended claims. The invention will be best understood from the following description when read in conjunction with the accompanying drawings.

BRIEF DESCRIPTION OF THE DRAWINGS

FIG. 1 is a cut-away perspective view of a pulser constructed in accordance with the present invention.

FIG. 2 is a sectional side elevation view of the pulser of FIG. 1.

FIG. 4 is a diagramatic view of a pulser constructed in accordance with another embodiment of the invention.

FIG. 7 is a perspective view of a pulser constructed in accordance with another embodiment of the invention.

FIG. 8 is a sectional view of the pulser of FIG. 7.

DESCRIPTION OF THE PREFERRED EMBODIMENTS

Figure 3:
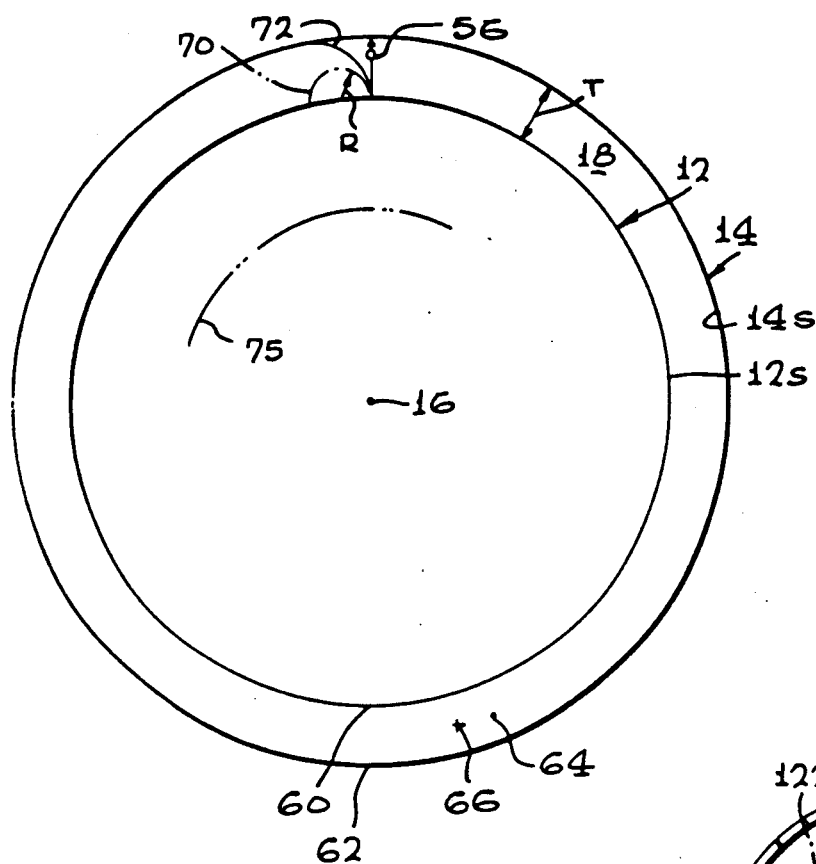
FIG. 3 is a simplified view taken on the line 3—3 of FIG. 2.

FIG. 2 illustrates a diode pulser 10 of the present invention, which includes inner and outer electrodes 12, 14 that are concentric with an axis 16 and which form a vacuum gap 18 of uniform thickness between them. The electrodes form a diode 20 across which electrons can flow, the gap 18 preferably being maintained at a vacuum pressure level in most applications.

A first circuit 22 includes a high voltage and high current power supply 24, inductors 26, 27 and a resistor 28, all connected in series with the electrodes 12, 14 of the diode. A second circuit 30 includes a magnet coil 32 which surrounds the electrodes, and which can create a magnetic field in the gap. The circuit also includes a power supply 34 and a switch 36 which can be closed to act as a control that is operable to suddenly apply current to the coil that establishes a magnetic field, indicated by lines 38, through the gap between the diode electrodes. The magnetic field lines 38 are "parallel" to the facing electrode surfaces because they appear to extend primarily parallel to the electrode surfaces as seen in a sectional view taken on a plane that includes the magnetic field lines where they extend along the gap.

To create a high voltage pulse, a switch 40 in the first circuit is closed, to allow the power supply 24 to pass current through the inductors 26, 27 and through the diode gap 18 between the diode electrodes. A moderate voltage is established across the diode, which is necessary to move electrons across the gap 18. When the current has risen to substantially its steady-state level, the switch 36 of the second circuit is suddenly closed, to suddenly supply an intense magnetic field (more than ten times ambient magnetism due to the earth's magnetic field) through the gap 18. The magnetic field causes electrons moving across the gap to be deflected, so a much higher voltage is required to move the electrons across the gap and continue the current flow through the diode. The inductors 26, 27 tend to maintain a constant current through the first circuit, for at least a short period of time, so the voltage across the diode increases to that level required to move the electrons across the diode gap. One result is the creation of a brief voltage pulse across the diode. A pair of output terminals 50, 52 therefore initially carry a moderate voltage followed by a high voltage pulse. Another result is that high energy electrons are created that traverse the gap 18.

If a series of high voltage pulses are desired, the second circuit switch 36 is opened immediately after the creation of the high voltage pulse, to reduce the impedance across the diode and allow the current in the first circuit 22 to build up to the original level. This assumes that the switch 40 in the first circuit continues to remain closed. When the current level in the first circuit again approaches the steady-state level, the second circuit switch 36 is again briefly closed to create another high voltage pulse. The diode includes terminals at 53, 54 where it connects to the rest of the first circuit. The inductor 27 is formed by concentric conductors 57, 59. The concentric conductors of the inductor 27 are spaced much more than the thickness of the diode electrode gap to avoid electron flow between the conductors 57, 58 and to provide a higher inductance.

FIG. 3 illustrates the trajectory of electrons in passing between electrode surfaces 12s and 14s of the inner and outer electrodes 12, 14. With substantially no magnetic field in the gap 18, the electrons indicated at 56 can move in a straight line between the electrodes.

When a magnetic field is applied in the directions 64 or 66, which are respectively out of the plane of the drawing or directly into the plane of the drawing, and which are both parallel to adjacent portions of &:he electrode surfaces 12S, 14S, the electrons are deflected into circular paths, such as indicated at 70. The radius R of the electron's circular path depends upon the strength of the magnetic field urging the electrons to move in a circle, as well as the strength of the electric field across the electrodes that urges the electrons to move across the gap. Since the inductor of the first circuit will increase the voltage across the gap until the electrons move across the gap, and the current in the first circuit remains substantially constant, the voltage across the gap will increase until the path of the electron is as indicated at 72, where the radius of curvature of the path equals the thickness T of the gap.

Although the diode pulser is useful in creating high voltage pulses, it can also be used where high energy electrons are required. If the diode of FIG. 3 is energized so the inner electrode 12 is positive and the outer electrode is negative, energetic electrons will flow across the gap toward the inner electrode. With the inner electrode formed of material that emits X-rays when struck by energetic electrons, X-rays will be generated that can be used to irradiate a target 75. The construction of the apparatus to utilize high energy electrons will be described below.

In one diode pulser that applicant has constructed, the inner electrode 12 has an outside diameter A (FIG. 2) of 10 cm and the outer electrode 14 has an inside diameter B of 12 cm, to provide a gap thickness of T 10 mm. The inner electrode has a length C of 67 cm to provide an area for a large current flow. The inductors 26, 27 have a combined inductance of 10 microhenries, and the power supply 24 produces a DC voltage of 15 kilovolts when connected through the inductor in series with the diode, with no substantial magnetic field through the diode. When activated, the second circuit 30 produces a magnetic field through the diode gap 18 of 3 kilogauss. This results in the voltage across the diode rising from about 15 kilovolts to about 500 kilovolts, or 0.5 megavolts. Before the pulse, the current I in the first circuit builds up towards about 100 kiloamperes, and this high current level exists in the 0.5 megavolt pulse for a period on the order of 10 microseconds.

The switch 36 of the second circuit which delivers current to the magnetic coil 32 switches power from a power supply 34 which has a voltage output of about 15 kilovolts. Thus, all switching, except that accomplished by the diode, occurs at only moderate voltage levels. The creation of the high voltage level of about 0.5 megavolts, does not involve the direct making and breaking of contact of switch parts, which could have the deleterious effect of causing erosion in such switch parts even where they lie in a vacuum. Instead, the switching occurs by magnetically-caused electron deflections, which increase the impedance across the diode from about 200 ohms to about 20,000 ohms. The diode pulser does not have any concentrated areas of erosion, and therefore provides a long lifetime of use while creating high voltage, high current pulses. In addition, the size of the diode pulser 10 across which high voltage and high current pulses are created, can be relatively small. This permits the pulser to have a relatively small size and weight.

The pulser of FIG. 2 has the advantage that stray inductances do not degrade operation. The inductor 27 formed by conductors 57, 58 that carry current to the diode would be considered a stray or parasitic inductance in a conventional pulser, but is part of the inductive energy store in the present pulser; in fact, it may be the major part of the inductive energy store in some applications.

The perhaps 0.5 megavolts across the cathode and anode 12, 14 of the diode, also appear across the series connection of inductors 26, 27. The inductor 27 stores energy in a vacuum to avoid problems of insulation breakdown. The inductance is proportional to the logarithm of the ratio of the diameters of the conductors 57, 58 and is proportional to their length.

Where very high voltage pulses are required, such as 5 megavolts to produce electrons that can generate gamma rays, most or substantially all of the inductances in the circuit 22 (FIG. 2) can be contained in the inductor 27 (by making it of large diameter and length). This has the advantage that only the vacuum between conductors 57, 58 has to withstand the high voltage, rather than a solid insulator. At the time the magnetic field is applied and a high voltage appears across the diode electrodes 12, 14, little voltage will appear across terminals 53, 54, because of the isolation provided by inductor 27.

FIG. 4 illustrates another circuit 80 wherein a single power supply 24 is used to not only build up the current level through the inductor 26 and diode 10, but also to power the magnetic coil 32. When a first switch 40 is closed, but a second switch 36 is open, current flows through the inductor 26 and diode 10 until a steady-state current level is approached or achieved. When a high voltage pulse is desired, the switch 36 is closed to cause a rapidly rising current level through the magnetic coil 32. The rising current through coil 32 results in a rising impedance of the diode 10 and the consequent rising voltage across the diode terminals 82, 84. Initially, the circuit is regenerative in that the higher voltage across the diode terminals 82, 84 results in increased voltage through the magnetic coil 32, which results in an even greater voltage across the diode. The result is a high voltage pulse across the terminals 50, 52 of the circuit. Of course, when the energy stored in the inductor 26 is depleted, the high voltage pulse will terminate.

Where the electrodes 12, 14 (FIG. 2) of the pulser are used under cold-cathode operation, high input-voltage rise rates and microsecond current pulse widths are typically needed. Accordingly, cold cathode operation is suitable where outputs in excess of half a megavolt and submicrosecond pulse time are desired. Where the electron-emitting cathode is heated to provide a thermionic cathode, it is desirably operated at lower voltages and current densities, to provide useful outputs as low as tens of kilovolts during periods of tens of microseconds. It may be noted that the anode 14 is provided with at least one gap 90 (FIG. 1) in its circumference, which may contain an insulator or a vacuum (if the diode is enclosed by another container), to prevent the magnetic field of coil 32 from inducing currents in the anode which would prevent the magnetic field from penetrating into the gap 18.

Figure 5:
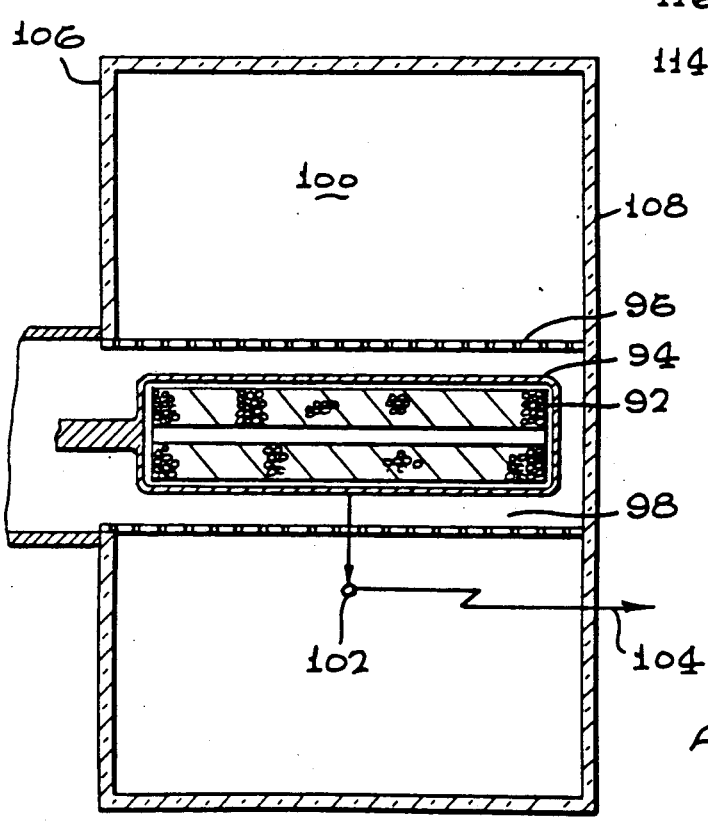
FIG. 5 is a sectional view of a pulser of the invention used to generate short wavelength light.

As mentioned above, the apparatus produces high energy electrons that are useful in a variety of applications. To provide a more accessible region, the magnetic coil can be positioned within the cathode, as illustrated in FIG. 5. In that apparatus the magnetic coil 92 lies within the cathode 94, and the cathode lies concentric within the anode 96. The cathode is interrupted by a gap in its circumference to prevent current induction, so the magnetic field can reach the gap 98. The region 100 around the anode 96 is relatively unobstructed. Where the high energy electrons strike the anode 96 to produce X-rays, material to be irradiated can be placed in the region 100. The anode 96 can be formed of screen mesh, or a slotted cylinder, covered with a foil, to allow the electrons to penetrate through the holes and foil into the region 100.

In an application for producing short wavelength (e.g. ultraviolet) high energy laser pulses, the region 100 contains xenon fluorine or krypton-fluorine gas mixtures and the anode 96 is of mesh covered with foil. When electrons 102 of an energy of a few hundred kilovolts excite molecules of such gas mixtures, the gas emits a laser beam 104. A pair of glass walls 106, 108 are provided to enclose the gas and pass the laser pulses.

Figure 6:
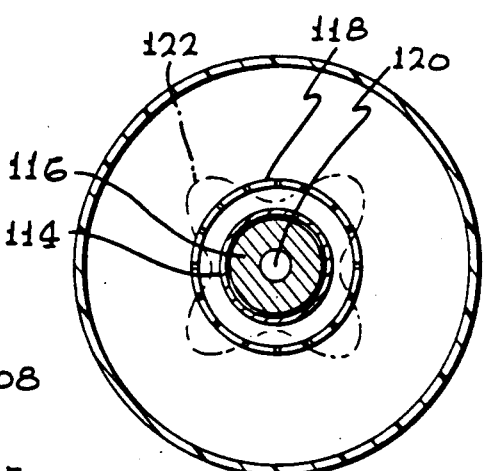
FIG. 6 is a sectional view of a pulser of the invention used to generate microwaves.

FIG. 6 illustrates an application for producing microwaves, where electrons emitted from the cathode 114 and curved by the magnetic field of coil 116, pass through a perforated anode 118. The electrostatic attraction of the anode causes the electrons to oscillate radially as they move around in a path indicated at 120, 122. The "cloud" of electrons forms an oscillating "virtual cathode" (known in the prior art) that emits microwaves, to thereby produce a high energy pulse (e.g. of one microsecond duration) of microwave radiation.

Although concentric electrodes are shown, the electrodes can be in the form of flat plates with their facing surfaces lying in spaced parallel planes, and with the magnetic field applied in any direction parallel to the planes of the electrode surfaces. FIGS. 7 and 8 illustrate such a diode 130 and an electromagnet coil 132 for applying a magnetic field indicated at 134 in the gap 136 between electrodes. In this illustrated diode, the electrodes are annular plates of 40 cm diameter and with holes 140 of 10 cm diameter, and the plates are spaced apart by 2 cm. The circuitry of FIGS. 2 or 4 can be used. Electrons moving between the plates move in the path 142 when the magnetic field is applied. Other electrode forms can be used. It should be noted that a magnetic field can be established by a current passing through a wire or other conductor that may be straight or in another configuration instead of curved, and the term "coil" includes all such configurations.

Thus, the invention provides a pulser which can use a power supply of moderate voltage and current output, to create brief pulses of high voltage and moderate current and a brief flow of high energy electrons, in a construction that is compact and of long lifetime of use. This is accomplished by the use of a diode connected in series with the power supply and inductor, and means for suddenly applying a magnetic field through the the gap between the electrodes in the diode. The magnetic field causes electrons to move in deflected paths to essentially increase the impedance across the diode gap. This results in a high voltage across the electrodes as the inductor maintains a largely constant current level for a brief period of time, and the creation of high energy electrons. The switching operation between a lower and higher impedance across the electrodes, does not involve the making or breaking of direct contact of switch parts, and the diode can be relatively compact and operate reliably for a long lifetime of use.

Although particular embodiments of the invention have been described and illustrated herein, it is recognized that modifications and variations may readily occur to those skilled in the art and consequently it is intended to cover such modifications and equivalents.

What is claimed is:

1. A pulser comprising:
   a diode having first and second electrodes that form electrode surfaces facing each other, said surfaces being spaced to form a gap between them;
   a circuit coupled to said electrodes and constructed to pass a voltage across said electrodes;
   means for rapidly establishing an intense magnetic field in said gap, in a direction which is substantially parallel to said electrode surfaces, so as to rapidly increase the impedance between said electrodes.

2. The pulser described in claim 1 wherein:
   said circuit includes an inductor connected to maintain a largely constant current flow between said electrodes, whereby to create a high voltage pulse between said electrodes.

3. The pulser described in claim 2 wherein:
   said means for rapidly increasing a magnetic field includes a coil and said control includes a switch that connects said coil substantially across said electrodes, so as to use the high voltage occurring across said electrodes to flow current through said coil.

4. The pulser described in claim 2 wherein:
   the more positive one of said electrodes forms an X-ray target means which emits X-rays when struck by high energy electrons.

5. The pulser described in claim 1 wherein:
   said first and second electrode surfaces are in the form of cylindrical surfaces concentric about a common axis, with the surface of said first electrode lying within the surface of said second electrode;
   said means for rapidly establishing a magnetic field includes a coil having multiple turns wound about said axis, and said control includes means for applying a current pulse to said coil to flow therethrough.

6. The pulser described in claim 5 wherein:
said first electrode includes a plurality of apertures, so as to allow electrons to pass therethrough.

7. A method for generating a high voltage and high wattage brief pulse comprising:
establishing a current in series flow through an inductor and between the substantially parallel surfaces of a pair of electrodes; rapidly applying a magnetic field between said electrode surfaces, with the magnetic field lines extending parallel to said surfaces, so as to rapidly increase the impedance between said electrode surfaces.

8. The method described in claim 7 wherein:
said step of applying a magnetic field includes coupling a coil between said electrodes, so the voltage between said electrodes causes a current flow through said coil, including placing said coil to create said magnetic field.

* * * * *